(12) United States Patent
Lee et al.

(10) Patent No.: US 11,133,449 B2
(45) Date of Patent: Sep. 28, 2021

(54) THERMOELECTRIC MATERIAL AND THERMOELECTRIC MODULE COMPRISING THE SAME

(71) Applicants: Hyundai Motor Company, Seoul (KR); Kia Motors Corporation, Seoul (KR)

(72) Inventors: Hoo Dam Lee, Seongnam-si (KR); Byung Wook Kim, Seongnam-si (KR); Jin Woo Kwak, Suwon-si (KR); Min Jae Lee, Seoul (KR); Woo Ju Lee, Seoul (KR); Yoon Jin Kim, Yongin-si (KR); Young Sun Kim, Seongnam-si (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 0 days.

(21) Appl. No.: 17/034,214

(22) Filed: Sep. 28, 2020

(65) Prior Publication Data

US 2021/0175405 A1    Jun. 10, 2021

(30) Foreign Application Priority Data

Dec. 6, 2019 (KR) .......................... 10-2019-0161991

(51) Int. Cl.
| | |
|---|---|
| *H01L 35/26* | (2006.01) |
| *H01L 35/34* | (2006.01) |
| *H01L 35/08* | (2006.01) |
| *H01L 35/24* | (2006.01) |
| *H01L 35/22* | (2006.01) |
| *H01L 35/12* | (2006.01) |
| *H01L 35/32* | (2006.01) |
| *H01L 35/30* | (2006.01) |

(52) U.S. Cl.
CPC ............... *H01L 35/26* (2013.01); *H01L 35/08* (2013.01); *H01L 35/12* (2013.01); *H01L 35/22* (2013.01); *H01L 35/24* (2013.01); *H01L 35/32* (2013.01); *H01L 35/34* (2013.01); *H01L 35/30* (2013.01)

(58) Field of Classification Search
CPC ......... H01L 35/02; H01L 35/08; H01L 35/12; H01L 35/22; H01L 35/24; H01L 35/26; H01L 35/32; H01L 35/34
See application file for complete search history.

(56) References Cited

U.S. PATENT DOCUMENTS

| | | | |
|---|---|---|---|
| 6,410,971 B1 * | 6/2002 | Otey | .................. H01L 35/32 |
| | | | 257/467 |
| 2014/0166065 A1 * | 6/2014 | Leu | ..................... H01L 35/16 |
| | | | 136/238 |

FOREIGN PATENT DOCUMENTS

| | | |
|---|---|---|
| KR | 101795931 B1 | 11/2017 |
| KR | 20190013468 A | 2/2019 |

\* cited by examiner

*Primary Examiner* — Lindsey A Bernier
(74) *Attorney, Agent, or Firm* — Slater Matsil, LLP (57) ABSTRACT

A thermoelectric material includes a lower part from a bottom surface of the thermoelectric material to a point of 30% of an average thickness of the thermoelectric material and having an average content of carbon atoms of 40 at% or more in the thermoelectric material, and an upper part corresponding to a remaining 70% of the average thickness of the thermoelectric material and having an average content of carbon atoms of 20 at% or less in the thermoelectric material.

20 Claims, 4 Drawing Sheets

FIG.1

(a) Before Optical Sintering (b) After Optical Sintering

FIG.2

(a) Before Optical Sintering (b) After Optical Sintering

THERMOELECTRIC MATERIAL AND THERMOELECTRIC MODULE COMPRISING THE SAME

CROSS-REFERENCE TO RELATED APPLICATIONS

This application claims priority to Korean Patent Application No. 10-2019-0161991, filed in the Korean Intellectual Property Office on Dec. 6, 2019, which application is hereby incorporated herein by reference.

TECHNICAL FIELD

The present disclosure relates to a thermoelectric material and a thermoelectric module including the same.

BACKGROUND

A thermoelectric module uses a Seebeck effect that generates the thermoelectric power by a temperature difference between opposite sides, and in general, a conventional thermoelectric module is manufactured on a bulk substrate by heat-molding or pressure-molding thermoelectric semiconductor particles. Therefore, it is difficult to be applied to a curved substrate. Because it is difficult to change a shape after being fixed once, a thermoelectric material is manufactured, and then is attached to a separate flexible substrate to be applied to make a thermoelectric module shape having a horizontal structure suitable for a thin film structure.

In particular, when forming a thermoelectric material by sintering through heat treatment at high temperature (350° C. or more) and/or high pressure, deformation of the flexible substrate vulnerable to heat occurs during sintering, and thus there is a problem that it is impossible to secure the integrity.

Therefore, there are a laser sintering, an electromagnetic sintering, and a plasma sintering which are capable of being sintered even at low temperatures. The laser sintering is not suitable for mass production, the electromagnetic sintering is difficult to perform selective sintering and to manufacture a dense thin film of high conductivity due to electromagnetic wave reflection, and the plasma sintering is difficult to maintain high-energy plasma and has low process efficiency for expensive equipment.

Accordingly, development of a thermoelectric material directly applicable to a flexible substrate to prevent thermal deformation of the substrate and research on the thermoelectric material excellent in adhesion to the substrate and thermoelectric performance are in progress.

SUMMARY

The present disclosure has been made to solve problems occurring in the prior art while advantages achieved by the prior art are maintained intact.

An embodiment of the present disclosure provides a thermoelectric material manufactured by an optical sintering using xenon white light instead of a high-temperature and/or high-pressure sintering, of which an upper part acts as a thermoelectric material to provide excellent thermoelectric performance and a lower part includes a carbon-based binder to provide improved adhesion to a substrate, unlike the conventional sintered material, and a thermoelectric module including the same.

The technical problems to be solved by the present inventive concept are not limited to the aforementioned problems, and any other technical problems not mentioned herein will be clearly understood from the following description by those skilled in the art to which the present disclosure pertains.

According to an embodiment of the present disclosure, a thermoelectric material includes a lower part from a bottom surface of the thermoelectric material to a point of 30% of an average thickness of the thermoelectric material and having an average content of carbon atoms of 40 at% or more in the thermoelectric material and an upper part corresponding to a remaining 70% of the average thickness of the thermoelectric material and having an average content of carbon atoms of 20 at% or less in the thermoelectric material.

In addition, according to an embodiment of the present disclosure, a thermoelectric module includes a lower substrate, a plurality of electrodes formed on the lower substrate, a plurality of thermoelectric materials formed to connect the plurality of electrodes, respectively, and an upper substrate provided to face the lower substrate.

BRIEF DESCRIPTION OF THE DRAWINGS

The above and other objects, features and advantages of the present disclosure will be more apparent from the following detailed description taken in conjunction with the accompanying drawings, in which.

DETAILED DESCRIPTION OF ILLUSTRATIVE EMBODIMENTS

Hereinafter, the present disclosure will be described in detail.

Embodiments of the present disclosure provide a thermoelectric material.

The thermoelectric material includes a lower part which has a thickness from a bottom surface to a point where it is 30% of an average thickness of the thermoelectric material and an average content of carbon atoms of 40 at% or more of the thermoelectric material, and an upper part which has a thickness corresponding to the remaining 70% of the average thickness of the thermoelectric material and an average content of carbon atoms of 20 at% or less of the thermoelectric material.

The average content (at%) of carbon atoms in the thermoelectric material is a content based on a total number of atoms included in the thermoelectric material. In the thermoelectric material, the lower part may have an average content of carbon atoms of 40 to 60 at%, preferably, 40 to 55 at%. When the average content of carbon atoms contained in the lower part of the thermoelectric material is less than 40 at% in the thermoelectric material, there is a problem that adhesion of the thermoelectric material to the substrate is lowered. In addition, in the case of more than 60 at%, thermoelectric performance of the thermoelectric material may decrease due to excessive binder content.

In addition, in the thermoelectric material, the upper part may have an average content of carbon atoms of 1 to 20 at%, preferably 5 to 20 at%.

When the average content of the carbon atoms contained in the upper part of the thermoelectric material is more than 20 at% in the thermoelectric material, the binder content in the thermoelectric material increases, and thus there is a problem that the thermoelectric performance is lowered.

The content of carbon atoms contained in the thermoelectric material may be measured using Scanning Electron Microscopy-Energy Dispersive Spectrometry (SEM-EDS) by the thermoelectric material position (by thickness profile) and a resulting value is the average content of carbon atoms by position.

The average thickness of the thermoelectric material means an average of a thickness at the thickest portion and a thickness at the thinnest portion from the bottom surface of the thermoelectric material.

The method of measuring the thickness of the thermoelectric material may be used without limitation as long as it is a method of measuring the thickness of a generally known thermoelectric material. For example, the thickness of the thermoelectric material may be measured using a vernier calipers or may be measured from a SEM cross-sectional view, but may be not limited thereto.

The thermoelectric material may be formed by optical sintering. For example, the thermoelectric material may be optically sintered by irradiating xenon white light having an energy of 5 to 15 J/cm2 for $1/1000$ to $1/100$ second at an applied voltage of 200 to 400V. Unlike the conventional thermal sintering at high temperature and high pressure, because the thermoelectric material is formed by the optical sintering at room temperature and normal pressure, the thermoelectric material has a microstructure different from that of the conventional thermoelectric material. In detail, the average content of the carbon atoms (that is, a content of the binder) is adjusted depending on a profile of the thickness inside the thermoelectric material, thereby improving the adhesion to the substrate while improving the thermoelectric performance.

In the thermoelectric material, the average content of carbon atoms in the lower part (the part from the bottom surface to the point of 30% of the average thickness of the thermoelectric material) may be more than twice as high as the average content of carbon atoms in the upper part (the remaining part corresponding to 70% of the average thickness of the thermoelectric material). When the above range is satisfied, the thermoelectric performance of the thermoelectric material is improved while the adhesion to the substrate is improved.

The average thickness of the thermoelectric material may be 10 to 40 μm, specifically may be 10 to 35 μm, and more specifically may be 15 to 30 μm. When the average thickness of the thermoelectric material is less than 10 μm, the thermoelectric performance may be lowered. When the average thickness of the thermoelectric material is more than 40 μm, brittleness of the thermoelectric material may occur to reduce the adhesion to the substrate.

The thermoelectric material may include a P-type thermoelectric material and an N-type thermoelectric material. That is, the thermoelectric material may be a P-type thermoelectric material or an N-type thermoelectric material.

The thermoelectric material may be a thermoelectric material used in the thermoelectric module. Specifically, the thermoelectric material may be a thermoelectric material used in a flexible thermoelectric module.

Embodiments of the present disclosure also provide a thermoelectric module.

The thermoelectric module may include a lower substrate, a plurality of electrodes formed on the lower substrate, a plurality of thermoelectric materials formed to connect the plurality of electrodes, respectively, and an upper substrate provided to face the lower substrate.

The lower substrate may be a flexible substrate. For example, the lower substrate may include at least one selected from the group consisting of polyethylene terephthalate (PET), polyimide (PI), polycarbonate (PC), and polyacrylonitrile (PAN). In particular, because the thermoelectric material is formed by optical sintering at room temperature and the lower substrate is not deformed by heat, the lower substrate may be used as a flexible material.

Each electrode may include at least one element selected from the group consisting of copper (Cu), nickel (Ni), carbon (C), titanium (Ti), tungsten (W), silver (Ag), platinum (Pt), palladium (Pd), and aluminum (Al).

Figure 7:
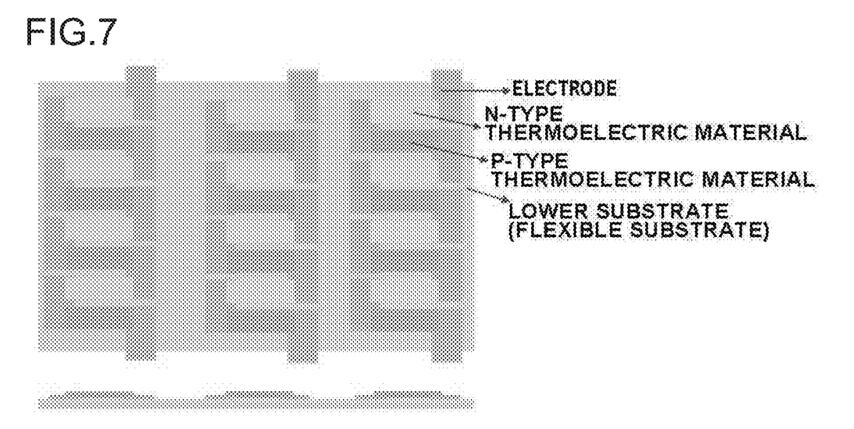
FIG. 7 is a view illustrating a screen printing schematic diagram of a thermoelectric module manufactured according to an embodiment of the present disclosure.
Figure 8:
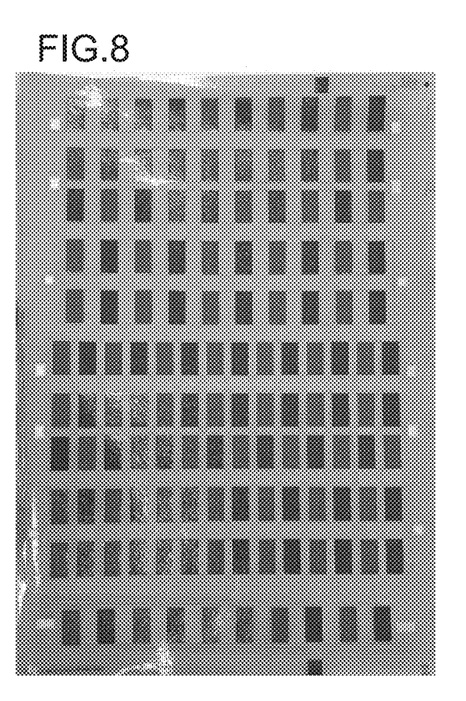
FIG. 8 is a view illustrating a state after manufacturing a thermoelectric module of Example 1 (without the upper substrate).

As described above, the thermoelectric materials, which are formed by optical sintering to provide a flexible thermoelectric module, may be formed by a screen printing on the lower substrate and/or the electrodes. As formed by the screen printing as described above, the thermoelectric materials may have a variety of patterns on the substrate as illustrated in FIG. 7 and may be formed directly on the flexible substrate to provide a thermoelectric module having flexibility.

An ink composition for forming the thermoelectric materials by the screen printing may include a binder including a powder for a thermoelectric semiconductor device and a polyester resin.

The powder for the thermoelectric semiconductor device may include at least one powder selected from the group consisting of Bi—Te-based alloy powder, Pb—Te-based alloy powder, Si—Ge-based alloy powder, Fe—Si-based alloy powder, and Co—Sb-based alloy powder. Specifically, the powder for the thermoelectric semiconductor device may include Bi2–ySbyTe3–zSez (0≤y≤2, 0≤z≤1), and may have various formulations depending on the N-type thermoelectric material or the P-type thermoelectric material.

For example, the powder for the N-type thermoelectric semiconductor device may basically include Bi2Te3, for example, may include Bi2(Te, Se)3 (wherein, the Se element is a doping element). In addition, the powder for the P-type thermoelectric semiconductor device may basically include Sb2Te3, and may include, for example, (Sb, Bi)2(Te, Se)3 (wherein, part of the Sb may be replaced by Bi).

The thermoelectric semiconductor device powder may be prepared by various methods as follows, but is not limited thereto.

For example, the thermoelectric semiconductor device powder may be manufactured by a method using an ampule (a raw material is placed in a quartz tube or a metal ampule and is sealed by vacuum to perform a heat treatment), an arc melting method (the raw material is placed in a chamber, arc is discharged under an inert gas atmosphere to melt the raw material to form a sample), a solid state reaction method (sintering after a powder is mixed well to be processed hard and then is heat-treated or the mixed powder is heat-treated and then processed), a metal flux method (elements that provide an atmosphere in which raw materials grow well into crystals at high temperature are added in a crucible and the raw materials are heat-treated at high temperatures to grow the crystals), a Bridgeman method (raw materials are put into a crucible, an end of the crucible is heated to high temperature until the raw material is dissolved, the high temperature region is slowly moved to dissolve a sample locally, and the entire sample is passed through the high temperature region to grow crystals), a zone melting method (raw materials are made in forms of seed rod and feed rod, are locally heated to a high temperature to dissolve a sample, and the melted portion is slowly pulled upwards to grow crystals), a vapor transport method (raw materials are put in a lower part of a quartz tube, are heated while an upper portion of the quartz tube is kept at a low temperature, and thus the raw materials are vaporized, causing solid phase reaction at the low temperature and crystals to grow), or a mechanical alloying method (raw powders and a steel ball are put in a cemented carbide material jar and rotated, and thus the steel ball mechanically impacts the raw powders to allow the raw powders to be alloyed).

The thermoelectric material may be a P-type thermoelectric material or an N-type thermoelectric material depending on the material of the ink composition.

The ink composition may include 5 to 20 parts by weight of a binder, based on 100 parts by weight of the powder for the thermoelectric semiconductor device, preferably, may include 8 to 17 parts by weight. When the content of the binder is less than 5 parts by weight based on 100 parts by weight of the powder for the thermoelectric semiconductor device, the adhesion to the lower substrate may be lowered, and when the amount of the binder is greater than 20 parts by weight, the thermoelectric performance may be deteriorated.

In addition, the ink composition may further include a solvent, and the solvent may be used without limitation as long as it may disperse the powder and the binder for the thermoelectric semiconductor device. For example, the solvent may include carbitol acetate and the like.

The solvent may be included in 5 to 20 parts by weight based on 100 parts by weight of the powder for the thermoelectric semiconductor device. When the content of the solvent in the ink composition is less than 5 parts by weight based on 100 parts by weight of the powder for the thermoelectric semiconductor device, dispersibility of the powder and the binder for the thermoelectric semiconductor device is lowered, and when it is more than 20 parts by weight, it is not suitable for screen printing.

The binder including the polyester resin may further include a polyvinylpyrrolidone resin. The polyvinylpyrrolidone resin is included in the ink composition and serves to improve the adhesion between the thermoelectric material and the lower substrate.

The ink composition may include the polyester resin and the polyvinylpyrrolidone resin in a weight ratio of 0.5:1 to 10:1, preferably in a weight ratio of 1:1 to 5:1. When the weight ratio of the polyester resin and the polyvinylpyrrolidone resin is less than 0.5:1, the thermoelectric performance may be excessively lower in comparison to the adhesion, and when the weight ratio is greater than 10:1, the adhesion to the substrate may be deteriorated.

In addition, the ink composition may be an ink composition for a thermoelectric material.

The upper substrate may be the same material as the lower substrate. Accordingly, the thermoelectric module manufactured may have flexibility. After the optical sintering, the thermoelectric material may be formed to be laminated on an upper end of the upper substrate for insulation.

Because the thermoelectric module manufactured as described above has flexibility, the thermoelectric module may be molded into various flexible forms.

Embodiments of the present disclosure also provide a method of manufacturing a thermoelectric module.

The method of manufacturing the thermoelectric module includes forming a plurality of electrodes on a lower substrate, forming thermoelectric materials using an ink composition to connect the plurality of electrodes, respectively, and laminating an upper substrate to face the lower substrate after the optical sintering.

The lower substrate, the electrodes, the ink composition, the thermoelectric material, and the upper substrate may be the same as described above.

The plurality of electrodes on the lower substrate may be formed by screen printing using an electrode paste. Accordingly, the plurality of electrodes may be patterned on the lower substrate, and the patterns may have various types.

The electrode paste may include at least one element selected from the group consisting of copper (Cu), nickel (Ni), carbon (C), titanium (Ti), tungsten (W), silver (Ag), platinum (Pt), palladium (Pd), and aluminum (Al), and various electrode pastes may be used as long as it is for screen printing.

Subsequently, the thermoelectric materials may be formed on the lower substrate by the screen printing using the ink composition to connect the plurality of electrodes, respectively. Here, the thermoelectric materials may be formed only on the lower substrate, but a part may be formed on the electrodes to connect the plurality of electrodes.

The optical sintering of the thermoelectric materials may be performed at room temperature and/or normal pressure. Specifically, the optical sintering may include irradiating xenon white light having an energy of 5 to 15 $J/cm^2$ with an applied voltage of 200 to 400V. A time for irradiating the xenon white light may be 1/1000 to 1/100 second. As described above, as being optically sintered, the thermoelectric materials have excellent penetrating power through an instantaneous light pulse and are capable of being sintered in a very fast time at room temperature. Accordingly, a large-area process may be implemented at a low temperature, and it is suitable for high-speed sintering through printing of a roll to roll (R2R) method.

After the optical sintering, the laminating of the upper substrate to face the lower substrate may be generally used without limitation as long as it is a method commonly used for screen printing materials.

The upper substrate may include a release layer on one surface thereof. Specifically, the release layer is removed before the laminating of the upper substrate, the upper substrate is mounted on the lower substrate to correspond to the electrode pattern, and then the method may further include pressing the upper substrate and the lower substrate using a high temperature hot pressing.

Hereinafter, the present disclosure will be described in detail with reference to the following Examples. However, the following Examples are merely to illustrate the present disclosure and the present disclosure is not limited by the following Examples.

Preparation Examples 1 to 8

Ink compositions having components of Table 1 below were prepared by a following method.

An N-type or P-type ink composition was prepared using $Bi_{2-y}Sb_yTe_{3-z}Se_z$ ($0 \leq y \leq 2$, $0 \leq z \leq 1$) thermoelectric particles. Here, $Bi_2Te_3$ (Alfa Aesar Co., Ltd.) was used as a powder for an N-type thermoelectric semiconductor device and $Sb_2Te_3$ (Alfa Aesar Co., Ltd.) was used as a powder for a P-type thermoelectric semiconductor device. Pulverized and scrubbed N-type or P-type thermoelectric semiconductor powder was mixed with a binder resin (polyester resin and/or polyvinylidene resin (Alfa Aesar Co., Ltd.)). Subsequently, a dispersant (Alfa Aesar Co., Ltd.) was added for even dispersion of the binder resin and the powder for the thermoelectric semiconductor device. Carbitol acetate (Alfa Aesar Co., Ltd.) was added as a solvent to adjust viscosity and printability of the composition.

Dispersion was carried out using the final prepared ink composition using a planetary mixer or thinky mixer. Subsequently, the ink composition (paste) for the thermoelectric material was manufactured by fully stirring using a 3 roll mill.

prepared ribbon was formed into a powder through a ball milling method, and then a powder of 50 μm or less was prepared by a sieving machine.

Subsequently, the prepared powder was put into a mold made of graphite to form a sintered body using a spark plasma sintering (SPS) method or a hot press method, and the process conditions were 400 to 500° C. and pressure of 20 MPa. The sintered body manufactured was cut into a pellet shape using a wire cutting technique.

Comparative Example 2

Ethyl cellulose of 1 wt % and α-terpineol were mixed in a thermoelectric material, and the binder resin was added in an amount of 10 to 15 wt % to prepare a thermoelectric material paste, and then a sintered body was manufactured by sintering at 400 to 450° C.

Comparative Example 3

A paste using Poly (3,4-ethylenedioxythiophene):polystyrenesulfonate (PEDOT:PSS) as a thermoelectric material was prepared and sintered at 400 to 450° C. to prepare a sintered body.

Experimental Example 1

Figure 1:
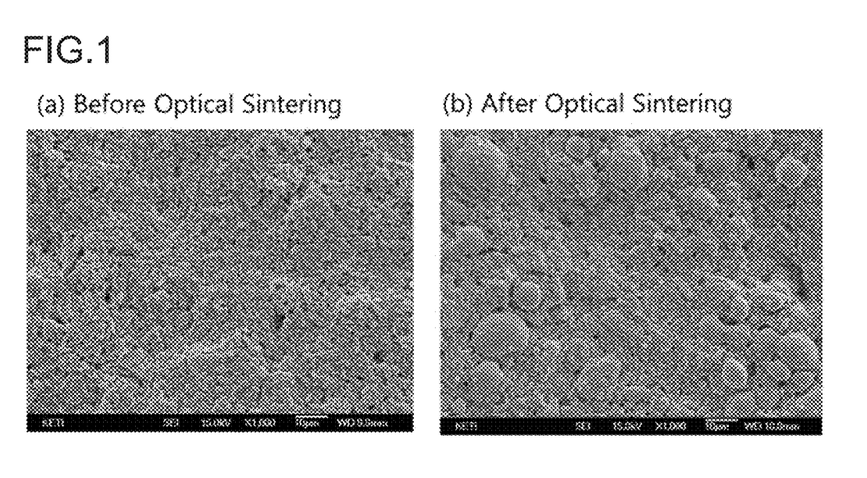
FIG. 1 is a view of a surface of a microstructure of a thermoelectric material of Example 1 according to Experimental Example 1 taken by a scanning electron microscope (SEM)
Figure 2:
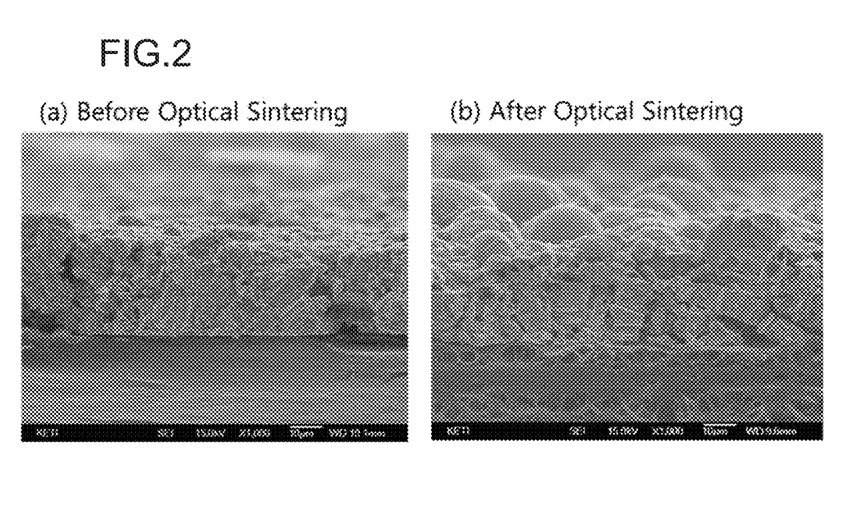
FIG. 2 is a cross-sectional view of the microstructure of the thermoelectric material of Example 1 according to Experimental Example 1 taken by the scanning electron microscope (SEM)

FIG. 1 (surface view) and FIG. 2 (cross-sectional view) are photographs taken by a scanning electron microscope (SEM) of a surface and a cross section of a microstructure of the thermoelectric material of Example 1, respectively. A

TABLE 1

| component | Preparation Example 1 | Preparation Example 2 | Preparation Example 3 | Preparation Example 4 | Preparation Example 5 | Preparation Example 6 | Preparation Example 7 | Preparation Example 8 |
|---|---|---|---|---|---|---|---|---|
| polyester resin | 5 | 5 | 5 | 5 | 6 | 5 | 5 | 6 |
| polyvinylpyrrolidone resin | 5 | 2 | 1 | — | — | 5 | 2 | — |
| N-type particle | 80 | 85 | 85 | 85 | 88 | — | — | — |
| P-type particle | — | — | — | — | — | 80 | 85 | 88 |
| dispersant | 1 | 1 | 1 | 1 | 1 | 1 | 1 | 1 |
| carbitol acetate | 9 | 7 | 8 | 10 | 6 | 9 | 7 | 5 |
| total | 100 | 100 | 100 | 100 | 100 | 100 | 100 | 100 |

Example 1

An electrode pattern was formed on a polyimide (PI) substrate using a copper paste for electrodes and the N-type ink composition of Preparation Example 5 and the P-type ink composition of Preparation Example 8 were alternatively screen-printed to have a height of 25 μm. The ink composition was filtered to be uniformly dispersed using SUS 200 mesh before screen printing.

The screen-printed electrode and thermoelectric material were dried for 10 minutes at 130° C. in a convection oven, and then were optical-sintered using a Pulse Forge 1300 (a xenon light irradiation device, NovaCentrix) at an applied voltage of 350V with energy of 12 J/cm² for 1/1000 seconds.

A polyimide (PI) substrate prepared in advance was laminated on an upper substrate by a high temperature hot pressing to prepare a thermoelectric module.

Comparative Example 1

Figure 3:
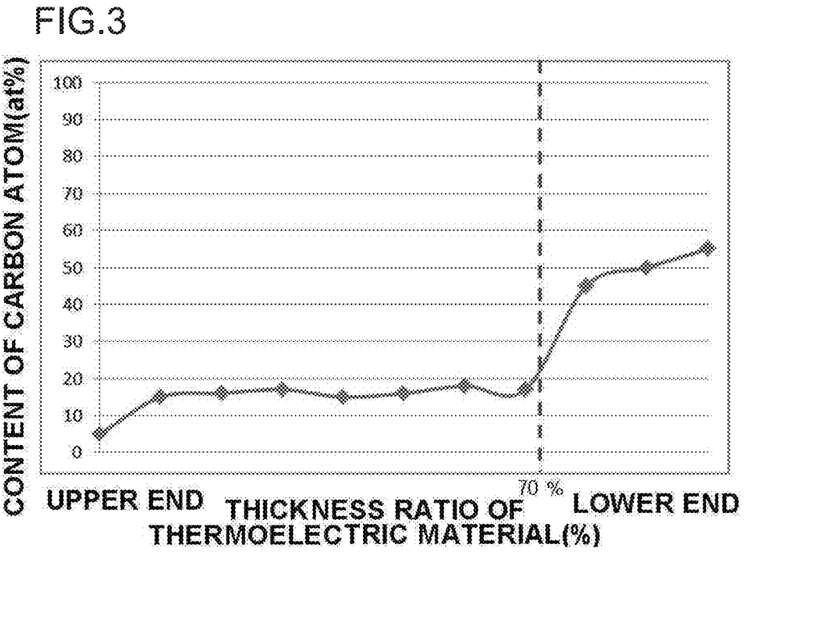
FIG. 3 is a graph illustrating a result of binder contents (average contents of carbon atoms) depending on a thickness profile of the thermoelectric material of Example 1 according to Experimental Example 1 measured by EDS.

A ribbon made of a thermoelectric material was prepared using a rapid solidification process (RPS) method. The result of binder contents (average contents of carbon atoms) depending on a thickness profile of the thermoelectric material after optical sintering, measured by EDS, is shown in FIG. 3.

Figure 4:
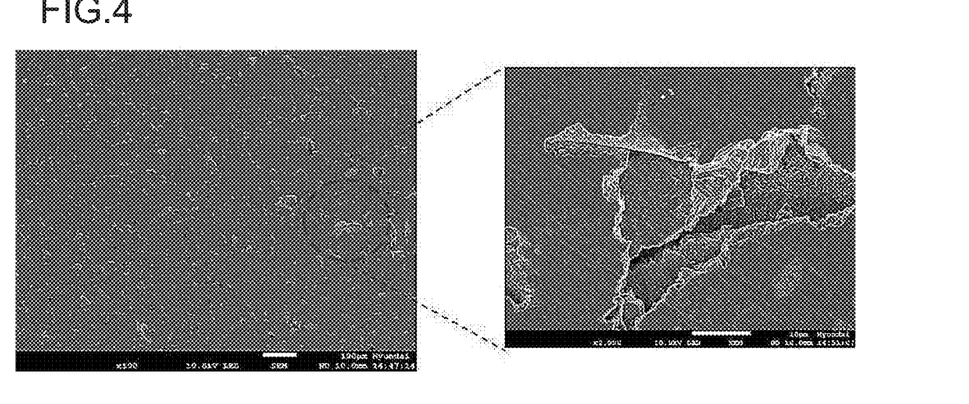
FIG. 4 is a view of a surface of a microstructure of a thermoelectric material of Comparative Example 1 according to Experimental Example 1 taken by a scanning electron microscope (SEM)
Figure 5:
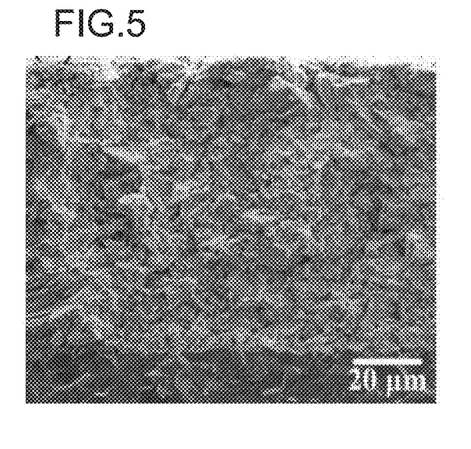
FIG. 5 is a view of a surface of a microstructure of a thermoelectric material of Comparative Example 2 according to Experimental Example 1 taken by the scanning electron microscope (SEM)
Figure 6:
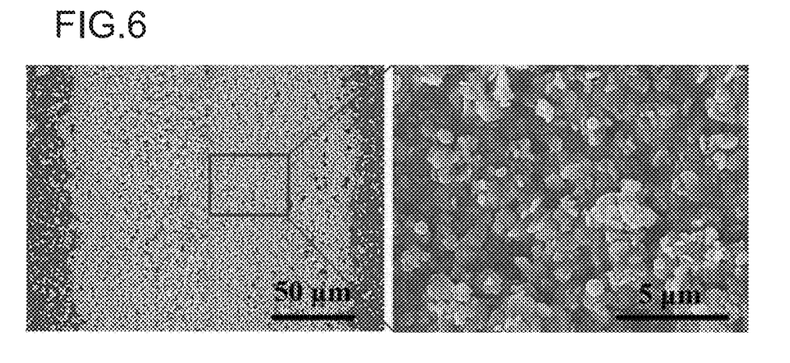
FIG. 6 is a view of a surface of a microstructure of a thermoelectric material of Comparative Example 3 according to Experimental Example 1 taken by the scanning electron microscope (SEM)

FIGS. 4 to 6 are photographs of surfaces of microstructures of the thermoelectric materials of Comparative Examples 1 to 3, taken by the scanning electron microscopy (SEM).

Referring to FIGS. 1 and 2, when the optical sintering of the microstructure of the thermoelectric material of Example 1 was complete, it was confirmed that phonon scattering effect due to non-uniform microstructures (a circular structure and micro-grain in a structure, etc.) caused by high energy accumulation was excellent and the adhesion to the substrate due to the binder remaining at the upper part of the thermoelectric material was excellent. When the binder content was also increased in the upper part, the thermoelectric performance was reduced, and therefore it was found that the thermoelectric material of embodiments of the present disclosure was suitable for the microstructure having the binder content which was increased from the upper part to the lower part.

Meanwhile, in the case of Comparative Example 1, it was possible to perform sintering of the thermoelectric material but high temperature/high pressure conditions were required, and in the case of Comparative Example 2, high temperature and long time sintering conditions were required, but in the thermoelectric material of Example 1 according to embodiments of the present disclosure, the desired microstructure of the thermoelectric material was capable of being obtained within a very short time, and therefore, it was confirmed that the thermoelectric performance as well as the adhesion to the flexible substrate was excellent. In addition, in the thermoelectric module of Example 1 according to embodiments of the present disclosure, a thermoelectric module having flexibility was capable of being manufactured by a simple process even without adding an organic thermoelectric material for adhesion to the substrate as described in Comparative Example 3.

Experimental Example 2

The thermoelectric materials prepared using the ink compositions according to Preparation Examples 1 to 8 were optically sintered under the same conditions as Example 1, and then results measuring electrical conductivity, thermal conductivity, Seebeck coefficient, ZT value, adhesive strength were illustrated in Table 2 below.

1. Electrical conductivity: measured with Keithley 2700.
2. Thermal conductivity: measured by a thermal conductivity equipment (TPS M1) of Hot disk Co., Ltd.
3. Seebeck Coefficient/Performance Index (ZT): Measurement of electrical conductivity with Keithley 2700, while measuring k-type temperature, voltage, and electrical resistance.

Seebeck coefficient=(voltage of a high temperature part-voltage of a low temperature part)/(high temperature temperature-low temperature).

Performance Index=(square of Seebeck coefficient×temperature)/(thermal conductivity×electrical resistance).

4. Adhesive strength: After forming a grid having 100 squares using a cross-cut-only kit based on ASTM D3359, a semi-transparent tape of 3M Co., Ltd. was attached, and then a desorption rate was evaluated.

5B: clean a cut surface and not separating a square from the grid.

4B: separating small pieces of coating at intersections (less than 5% of grid area).

3B: separating small pieces of coating along edges and at intersections of a cut part (more than 5% and less than 15% of the grid area).

2B: separating a cut edge of coating and apart of the square (more than 15% less than 35% of the grid area).

1B: greatly peeling off the cut edge of the coating and separating the rectangle (more than 35% or less than 65% of the grid area).

0B: peeling and separating more than 1B (65% or more of the grid area).

TABLE 2

| categories | Preparation Example 1 | Preparation Example 2 | Preparation Example 3 | Preparation Example 4 | Preparation Example 5 | Preparation Example 6 |
| --- | --- | --- | --- | --- | --- | --- |
| Electrical conductivity (S/m) | 14800 | 14700 | 29500 | 34700 | 85200 | 47500 |
| Thermal conductivity (W/mK) | 1.51 | 1.72 | 1.75 | 1.8 | 1.9 | 1.53 |
| Seebeck coefficient ($10^{-5}$ V/K) | 7.3 | 8.4 | 9.2 | 9.7 | 10.2 | 9.9 |
| ZT | 0.16 | 0.023 | 0.043 | 0.054 | 0.14 | 0.091 |
| Adhesion strength | 5B | 5B | 5B | 5B | 4B | 5B |

| categories | Preparation Example 7 | Preparation Example 8 | Comparative Example 1 | Comparative Example 2 | Comparative Example 3 |
| --- | --- | --- | --- | --- | --- |
| Electrical conductivity (S/m) | 94500 | 122000 | 120000 or more | 100000 or less | 100000 or less |
| Thermal conductivity (W/mK) | 1.67 | 1.8 | 1.8-2.0 | 1.6-1.8 | 1.5-2.0 |
| Seebeck coefficient ($10^{-5}$ V/K) | 10.3 | 11.9 | 15 or more | 10 or less | 10 or less |
| ZT | 0.18 | 0.288 | 0.5-1.0 | 0.1 or less | 0.1 or less |
| Adhesion strength | 5B | 4B | X (no bonding) | X (no bonding) | 1B |

In Comparative Example 1, it was possible to secure a high ZT value, but it was impossible to bond to the substrate. In Comparative Example 2, it was difficult to secure a thermoelectric performance index due to a low sintering temperature and it was impossible to bond to the substrate. In Comparative Example 3, some bonding performance was secured by the PEDOT:PSS component, but the adhesive strength was very weak, which was not suitable as a thermoelectric module.

It was confirmed that the optical sintered thermoelectric materials prepared by the ink compositions according to Preparation Examples 1 to 8 had high thermoelectric performance (ZT) of up to 0.288 as compared to the conventional material, and the adhesive strength was excellent.

Embodiments of the present disclosure may prevent the thermal deformation of the flexible substrate by the optical sintering method using xenon white light, unlike the conventional sintering method by heat treatment, and thus it is possible to directly apply the thermoelectric material to the flexible substrate, thereby providing the flexible thermoelectric module through the fast and quick process.

In addition, the thermoelectric material of embodiments of the present disclosure may adjust the binder content depending on the thickness profile of the thermoelectric material, and thus the upper part serves as the thermoelectric material and the lower part includes the carbon (C)-based binder to improve the adhesion to the substrate.

Hereinabove, although the present disclosure has been described with reference to exemplary embodiments and the accompanying drawings, the present disclosure is not limited thereto, but may be variously modified and altered by those skilled in the art to which the present disclosure pertains without departing from the spirit and scope of the present disclosure claimed in the following claims.

What is claimed is:

1. A thermoelectric material comprising:
    a lower part from a bottom surface of the thermoelectric material to a point of 30% of an average thickness of the thermoelectric material and having an average content of carbon atoms of 40 at% or more in the thermoelectric material; and
    an upper part corresponding to a remaining 70% of the average thickness of the thermoelectric material and having an average content of carbon atoms of 1 to 20 at% in the thermoelectric material.

2. The thermoelectric material of claim 1, wherein the average thickness is 10 to 40 μm.

3. The thermoelectric material of claim 1, wherein the average content of carbon atoms contained in the lower part is 40 to 60 at% in the thermoelectric material.

4. The thermoelectric material of claim 1, wherein the average thickness is 10 to 40 μm; and
    wherein the average content of carbon atoms contained in the lower part is 40 to 60 at% in the thermoelectric material.

5. The thermoelectric material of claim 1, wherein the thermoelectric material includes a P-type thermoelectric material and an N-type thermoelectric material.

6. The thermoelectric material of claim 1, wherein the thermoelectric material is optically sintered by irradiating $1/1000$ to $1/100$ second of xenon white light having an energy of 5 to 15 J/cm$^2$ with an applied voltage of 200 to 400V.

7. A thermoelectric module comprising:
    a lower substrate;
    a plurality of electrodes formed on the lower substrate;
    a thermoelectric material formed to connect the plurality of electrodes, respectively, the thermoelectric material comprising:
        a lower part from a bottom surface of the thermoelectric material to a point of 30% of an average thickness of the thermoelectric material and having an average content of carbon atoms of 40 at% or more in the thermoelectric material; and
        an upper part corresponding to a remaining 70% of the average thickness of the thermoelectric material and having an average content of carbon atoms of 1 to 20 at% in the thermoelectric material; and
    an upper substrate provided to face the lower substrate.

8. The thermoelectric module of claim 7, wherein the lower substrate comprises a material selected from the group consisting of polyethylene terephthalate (PET), polyimide (PI), polycarbonate (PC), and polyacrylonitrile (PAN), and combinations thereof.

9. The thermoelectric module of claim 7, wherein the plurality of electrodes includes an electrode formed from a material selected from the group consisting of copper (Cu), nickel (Ni), carbon (C), titanium (Ti), tungsten (W), silver (Ag), platinum (Pt), palladium (Pd), and aluminum (Al), and combinations thereof.

10. The thermoelectric module of claim 7, wherein the thermoelectric material includes a P-type thermoelectric material and an N-type thermoelectric material.

11. The thermoelectric module of claim 7, wherein the upper substrate is formed of the same material as the lower substrate.

12. The thermoelectric module of claim 7, wherein the thermoelectric material is optically sintered by irradiating $1/1000$ to $1/100$ second of xenon white light having an energy of 5 to 15 J/cm$^2$ with an applied voltage of 200 to 400V.

13. The thermoelectric module of claim 10, wherein the P-type thermoelectric material and the N-type thermoelectric material are alternately formed.

14. The thermoelectric module of claim 7, wherein the average thickness is 10 to 40 μm.

15. The thermoelectric module of claim 7, wherein the average content of carbon atoms contained in the lower part is 40 to 60 at% in the thermoelectric material.

16. A thermoelectric material comprising:
    a lower part from a bottom surface of the thermoelectric material to a point of 30% of an average thickness of the thermoelectric material and having an average content of carbon atoms of 40 to 60 at% in the thermoelectric material; and
    an upper part corresponding to a remaining 70% of the average thickness of the thermoelectric material and having an average content of carbon atoms of 20 at% or less in the thermoelectric material.

17. The thermoelectric material of claim 16, wherein the average thickness is 10 to 40 μm.

18. The thermoelectric material of claim 16, wherein the average content of carbon atoms contained in the upper part is 1 to 20 at% of the thermoelectric material.

19. The thermoelectric material of claim 16, wherein the thermoelectric material includes a P-type thermoelectric material and an N-type thermoelectric material.

20. The thermoelectric material of claim 16, wherein the thermoelectric material is optically sintered by irradiating $1/1000$ to $1/100$ second of xenon white light having an energy of 5 to 15 J/cm$^2$ with an applied voltage of 200 to 400V.

* * * * *